US010522657B2

(12) United States Patent
Kuang et al.

(10) Patent No.: US 10,522,657 B2
(45) Date of Patent: Dec. 31, 2019

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Shin-Jiun Kuang, Hsinchu (TW); Yi-Han Wang, Yunlin County (TW); Tsung-Hsing Yu, Taipei (TW); Yi-Ming Sheu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/138,462

(22) Filed: Sep. 21, 2018

(65) Prior Publication Data

US 2019/0019881 A1     Jan. 17, 2019

Related U.S. Application Data

(62) Division of application No. 14/311,921, filed on Jun. 23, 2014, now Pat. No. 10,084,063.

(51) Int. Cl.
*H01L 29/417*     (2006.01)
*H01L 21/8238*    (2006.01)
(Continued)

(52) U.S. Cl.
CPC ...... *H01L 29/66636* (2013.01); *H01L 29/165* (2013.01); *H01L 29/7848* (2013.01)

(58) Field of Classification Search
CPC . H01L 21/823418–823425; H01L 21/823814; H01L 21/02592;
(Continued)

(56) References Cited

U.S. PATENT DOCUMENTS 5,075,259 A * 12/1991 Moran .................. H01L 21/288
257/E21.174
7,488,660 B2 * 2/2009 Dyer ............... H01L 21/823418
438/199
(Continued)

FOREIGN PATENT DOCUMENTS

CN          103426739 A     12/2013

OTHER PUBLICATIONS

Office Action and Search Report dated Dec. 14, 2018 issued by China National Intellectual Property Association (CNIPA) for counterpart application 201510093212.3.
(Continued)

*Primary Examiner* — Mary A Wilczewski
*Assistant Examiner* — Tsz K Chiu
(74) *Attorney, Agent, or Firm* — WPAT, P.C., Intellectual Property Attorneys; Anthony King

(57) ABSTRACT

A semiconductor device includes a gate structure located on a substrate; and a raised source/drain region adjacent to the gate structure. An interface is between the gate structure and the substrate. The raised source/drain region includes a stressor layer providing strain to a channel under the gate structure; and a silicide layer in the stressor layer. The silicide layer extends from a top surface of the raised source/drain region and ends below the interface by a predetermined depth. The predetermined depth allows the stressor layer to maintain the strain of the channel.

20 Claims, 9 Drawing Sheets

(51) Int. Cl.
*H01L 29/165* (2006.01)
*H01L 29/16* (2006.01)
*H01L 29/08* (2006.01)
*H01L 21/768* (2006.01)
*H01L 21/8234* (2006.01)
*H01L 29/66* (2006.01)
*H01L 29/78* (2006.01)

(58) Field of Classification Search
CPC ......... H01L 21/02532; H01L 21/02293; H01L 21/02631; H01L 21/02634; H01L 21/2018; H01L 21/2022–2026; H01L 21/2033–2036; H01L 21/2085; H01L 21/2855; H01L 21/3147; H01L 21/76248; H01L 21/76262; H01L 21/76278; H01L 21/76294; H01L 21/76297; H01L 21/28052; H01L 21/2806; H01L 21/28097; H01L 21/28518; H01L 21/76897; H01L 21/823443; H01L 21/823835; H01L 29/4933; H01L 29/4941; H01L 29/4975; H01L 29/665–66507; H01L 29/7845; C30B 25/02–22
See application file for complete search history.

(56) References Cited

U.S. PATENT DOCUMENTS

| | | | | |
|---|---|---|---|---|
| 9,972,692 | B2 * | 5/2018 | Choi | H01L 27/0924 |
| 2005/0280098 | A1 * | 12/2005 | Shin | H01L 21/823814 257/371 |
| 2007/0254414 | A1 * | 11/2007 | Miyanami | H01L 29/165 438/149 |
| 2007/0298573 | A1 * | 12/2007 | Lin | H01L 21/28097 438/300 |
| 2008/0099921 | A1 * | 5/2008 | Katata | H01L 21/76877 257/751 |
| 2008/0166840 | A1 * | 7/2008 | Ting | H01L 21/26506 438/197 |
| 2009/0039399 | A1 * | 2/2009 | Sudo | H01L 29/0847 257/288 |
| 2010/0078689 | A1 * | 4/2010 | Kronholz | H01L 21/823412 257/288 |
| 2010/0109046 | A1 | 5/2010 | Mehandru et al. | |
| 2012/0223372 | A1 * | 9/2012 | Alptekin | H01L 21/28518 257/288 |
| 2013/0175606 | A1 * | 7/2013 | Cheng | H01L 21/823807 257/329 |
| 2013/0316535 | A1 * | 11/2013 | Shin | H01L 21/28 438/682 |
| 2015/0021688 | A1 * | 1/2015 | Sung | H01L 21/823412 257/344 |

OTHER PUBLICATIONS

Foreign Patent Document CN103426739A is a family patent to US Patent Publication 20100109046.

* cited by examiner

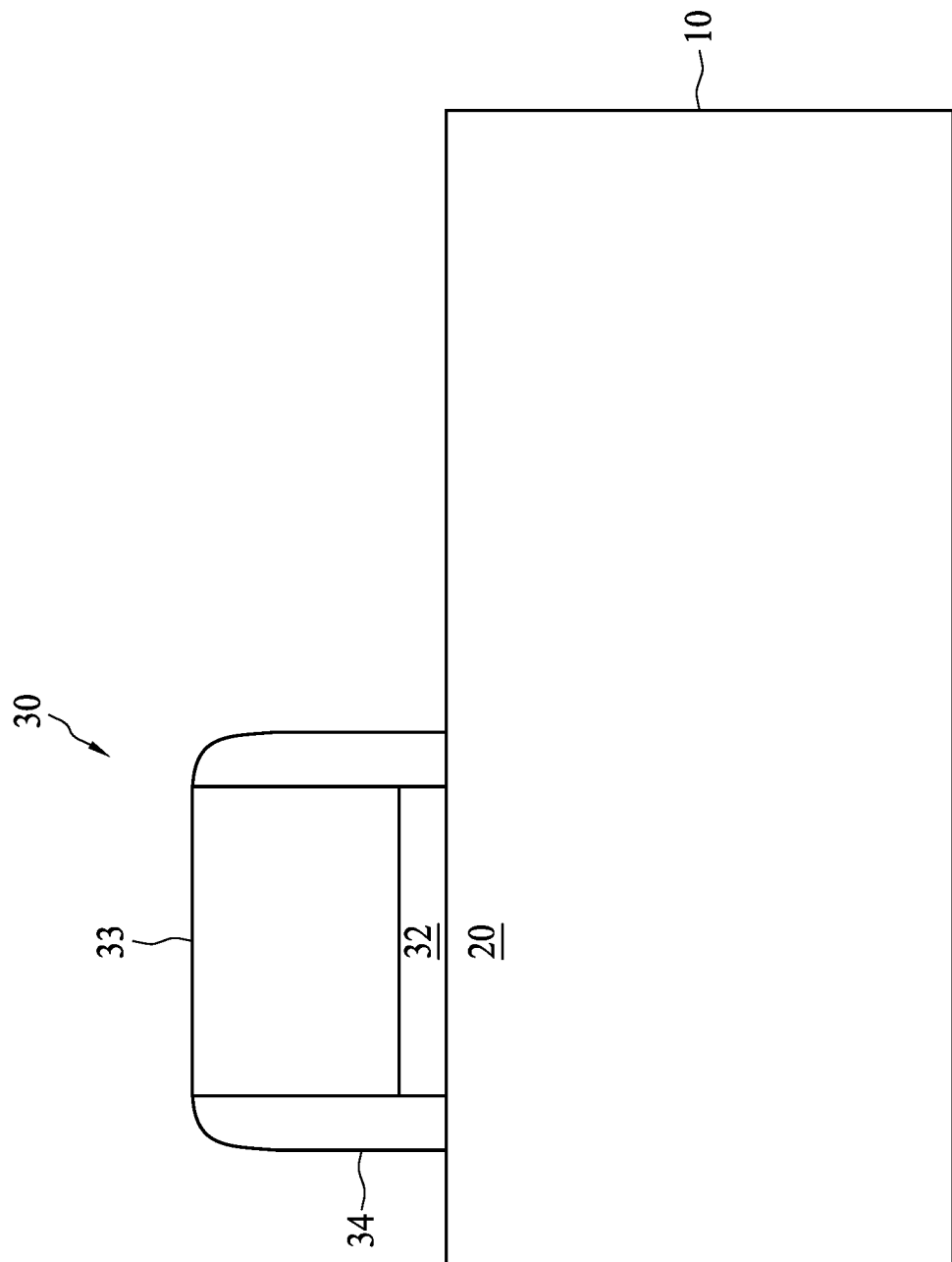

SEMICONDUCTOR DEVICE AND MANUFACTURING METHOD THEREOF

CROSS REFERENCE TO RELATED APPLICATIONS

This application is a division of application Ser. No. 14/311,921, filed on Jun. 23, 2014. All of the above-referenced applications are hereby incorporated herein by reference in their entirety.

FIELD

The present disclosure relates to a semiconductor device and in particular, to a semiconductor device with a more efficient electrical performance and a method of manufacturing a semiconductor device.

BACKGROUND

There exists a continuing requirement to improve semiconductor device performance and scale down semiconductor devices. As the size reduces, the performance requirements become more stringent. A characteristic that limits scalability and device performance is electron and/or hole mobility throughout the channel region of transistors. Another characteristic that limits scalability and device performance is the total resistance of transistors. For example, the current performance of devices is highly relative to the total resistances and mobility of carriers.

One technique that may improve scaling limits and device performance is to introduce strain into the channel region, which can improve electron and/or hole mobility. Different types of strain, including expansive strain, uniaxial tensile strain, and compressive strain, have been introduced into channel regions of various types of transistors in order to determine their effect on electron and/or hole mobility.

One technique that may improve scaling limits and device performance is to reduce the contact resistance. In 45 nm technology and below, the external resistance $R_{EXT}$ dominates the performance of the device drive currents. In addition, it is found that contact resistance holds a majority of the external resistance $R_{EXT}$. High contact resistance causes the device drive currents to reduce. However, there is no optimized profile of a source/drain region that is able to reduce contact resistance and at the same time not influence the strain in the channel region. In order to obtain higher drive currents and a more efficient performance, a new profile of a source/drain region is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are cross-sectional diagrams illustrating a manufacturing process of the semiconductor device of FIG. 1 in accordance with some embodiments of the present disclosure.

DETAILED DESCRIPTION

Figure 1:
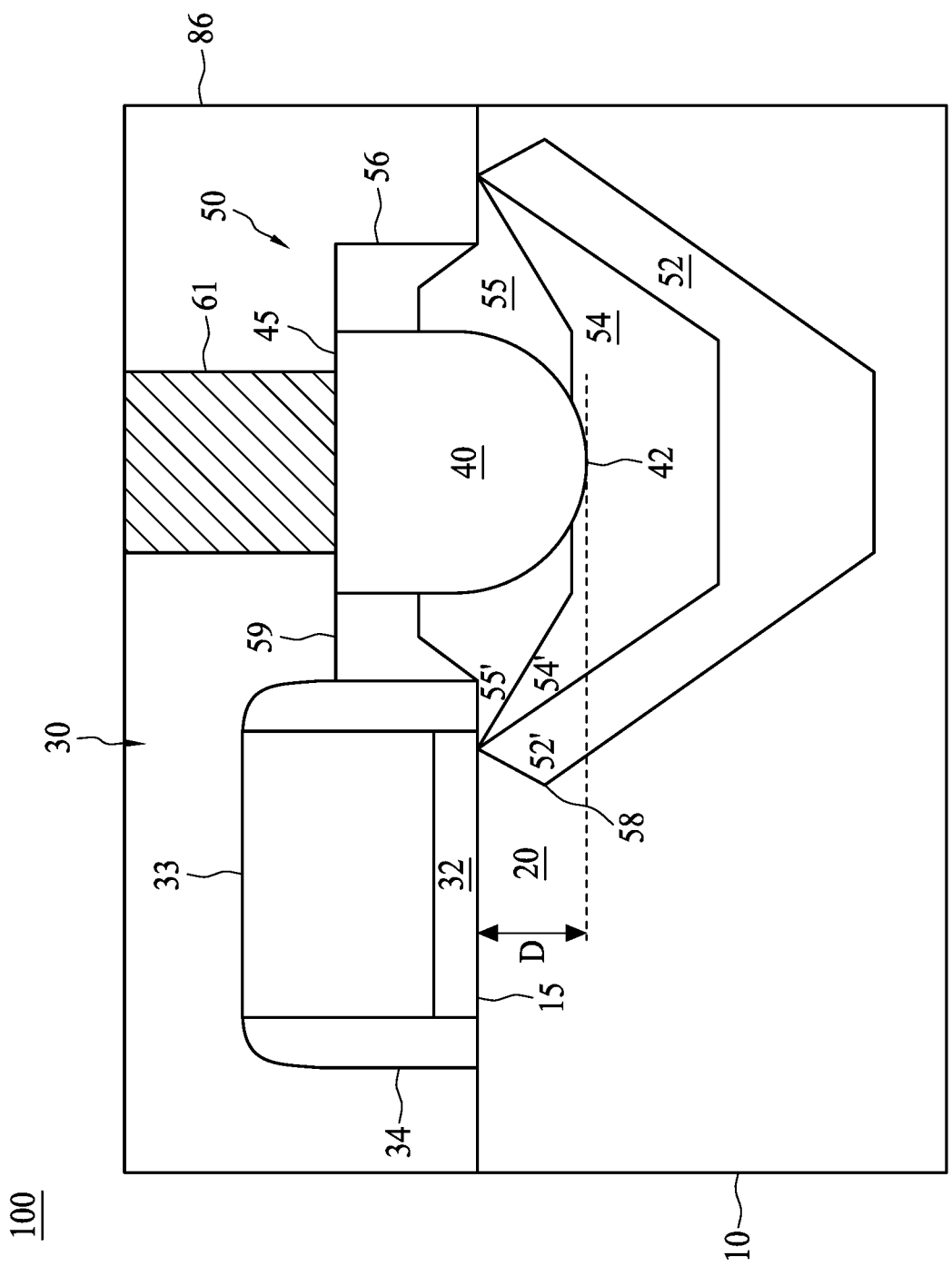
FIG. 1 is a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor needs not be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

IC manufacturers have made great effort to improve the performance of NMOS and PMOS transistors. One technique for improving performance is to reduce the channel length of the transistors. However, reduction of the physical size of the transistor has faced a physical and electrical limitation due to manufacturing tools and techniques. Thus, IC manufacturers have turned to develop other techniques to improve the performance of NMOS and PMOS transistors. Another technique used to improve device performance is to establish a certain strain in the channel region of the transistors. One or more layers of material, such as silicon carbide or silicon germanium, are formed under or adjacent to the channel region so as to induce strain in the channel region of the transistor. In NMOS transistors, it is designed to create a tensile stress in the channel regions so as to increase the mobility of carriers. In contrast, it is designed to create a compressive stress in the channel regions of the PMOS transistors. Thus, the stress in the channel region improves the switching speed and drive current.

Another technique used to improve the device performance is to reduce the total resistances of such devices. With regard to the scaling of integrated circuits, the current performance of devices is highly relative to the total resistances of such devices. In recent and next generation IC technology, the external resistance $R_{EXT}$ dominates the performance of the device drive currents. In addition, it is found that contact resistance holds a majority of the external resistance $R_{EXT}$. High contact resistance causes the device drive currents to reduce. Thus, IC manufacturers may alter material of the contact electrode, for example, using a metal silicide layer to reduce the contact resistance. It is found that some metal silicide layers, such as NiSi, have great performance as a contact electrode. Further, the contact resistance can also be adjusted by enlarging a contact area between the metal silicide layer and the source/drain region. The metal silicide layers are not merely formed on the source/drain region. The metal silicide layer starts to extend into the source/drain region so that the contact area can be enlarged. For example, the metal silicide layer can be shaped as a pocket profile extending into the source/drain region. However, as the metal silicide layer extends deeper in depth, the strain of the channel region is released and changed. Although the contact resistance is reduced by the deeper depth, the effect of the strain can be minimized because the strain in the channel is released. It is a tradeoff between a depth of the metal silicide layer and the strain of the channel region. It is difficult to maintain the exerted strain in the channel region and simultaneously change the profile of the metal silicide layer. Thus, there is no optimized contact electrode shape, depth, and relative position in the source/drain region. With an inadequate contact electrode shape, the strain feature could disappear, and thereby the device performance will be degraded. The present embodiments provide a contact electrode profile that simultaneously reduces the contact resistance and maintains the strain in the channel region. Thus, the contact resistance can be reduced, and meanwhile, the strain can be kept in order to increase the mobility of carriers. The drive current can be dramatically increased so that the device performance is improved.

In reference to the Figures, FIG. 1 is a semiconductor device 100 in accordance with some embodiments of the present disclosure. The semiconductor device 100 is a metal oxide silicon field effect transistor (MOSFET). The semiconductor device 100 includes a gate structure 30, a substrate 10, a channel region 20, a silicide layer 40 and a raised source/drain region 50.

With regard to the semiconductor device 100, the gate structure 30 is located on the substrate 10. The channel region 20 is disposed below the gate structure 30. There is an interface 15 between the gate structure 30 and the substrate 10. The raised source/drain region 50 is disposed adjacent to the gate structure 30. In general, there are two raised source/drain regions on the opposite sides of the gate structure 30. Thus, another raised source/drain region is opposite to the raised source/drain region 50 but not shown in figures. A portion of the raised source/drain region 50 is located underneath the gate structure 30. The silicide layer 40 is located in the raised source/drain region 50.

In an embodiment, the substrate 10 is a silicon-on-insulator (SOI) substrate. The SOI substrate includes a bulk silicon layer, a buried insulation layer and an active layer, wherein semiconductor devices are formed in and above the active layer. In an embodiment, the substrate 10 is a silicon substrate or made of materials other than silicon, for example, silicon germanium, silicon carbide, germanium, III-V compound semiconductors.

The gate structure 30 further includes a gate dielectric 32, a gate electrode 33, and sidewall spacers 34. The gate dielectric 32 is located on the channel region 20. In some embodiments, the gate dielectric 32 includes silicon dioxide or, in an alternative embodiment, a high dielectric constant (K) material. In some embodiments, the gate dielectric 32 includes a dielectric material based on silicon oxide, e.g., silicon oxynitride, silicon oxide, or a stack of at least one silicon oxide and at least one silicon nitride. In some embodiments, the gate dielectric 32 includes a dielectric metal oxide having a dielectric constant greater than 8.0, which is known as a high-k dielectric material. Exemplary high-k dielectric materials include $La_2O_3$, $HfO_2$, $ZrO_2$, $Al_2O_3$, $TiO_2$, $SrTiO_3$, $LaAlO_3$, $HfO_xN_y$, $Y_2O_3$, $LaAlO_xN_y$, $ZrO_xN_y$, $La_2O_xN_y$, $TiO_xN_y$, $SrTiO_xN_y$, $Al_2O_xN_y$, $Y_2O_xN_y$, and an alloy thereof. Each value of x is independently from 0.1 to 3.0 and each value of y is independently from 0.1 to 3.0.

The gate electrode 33 is located on the gate dielectric 32. In some embodiments, the gate electrode 33 includes standard polysilicon, which refers to a poly-gate. In some embodiments, the gate electrode 33 includes amorphous polysilicon material, a metal material, silicide metal material, or a stack of at least one metallic material and at least one semiconductor material. The gate electrode 33 serves as a gate terminal in order to control the channel region 20. The material is chosen to meet the requirement of resistance.

The sidewall spacers 34 conform to the stack of the gate electrode 33 and the gate dielectric 32. In addition, the sidewall spacers 34 are respectively located on opposite sides of the stack. In some embodiments, the sidewall spacers 34 include silicon nitride. In some embodiments, the sidewall spacers 34 include silicon dioxide, silicon carbide, or silicon oxy-nitride, without limitation. Specifically, the material of the sidewall spacers 34 is different from the material of the gate electrode 33 or the gate dielectric 32.

The channel region 20 is disposed under the gate structure 30. The channel region 20 is formed in the substrate 10. In an embodiment, the channel region 20 is n-type and includes dopants, for example, phosphorous, arsenic, and/or antimony. In an embodiment, the channel region 20 is p-type and includes dopants, for example, boron, germanium, and/or indium.

The raised source/drain region 50 is disposed adjacent to the gate structure 30. The raised source/drain regions 50 are formed, for example, by an epitaxial growth of a semiconductor material within a cavity or a recess in the substrate 10.

Because the epitaxial growth forms the raised source/drain regions 50 layer by layer, it is sufficient to control profile and dopant concentrations of the raised source/drain regions 50. The raised source/drain region 50 includes a first epitaxial-grown doped layer 52, a second epitaxial-grown doped layer 54, a third epitaxial-grown doped layer 55, and a fourth epitaxial-grown doped layer 56. The first epitaxial-grown doped layer 52 makes contact with the substrate 10, which is also regarded as epitaxial-grown doped liners that fill up a cavity of the substrate 10. Because the cavity is a U-shaped or a V-shaped cavity, the first epitaxial-grown doped layer 52 forms a U-shaped or a V-shaped structure in the substrate 10. The second epitaxial-grown doped layer 54 is located on the first epitaxial-grown doped layer 52. The third epitaxial-grown doped layer 55 is located on the second epitaxial-grown doped layer 54. The fourth epitaxial-grown doped layer 56 is located on the third epitaxial-grown doped layer 55.

The first, second and third epitaxial-grown doped layers (52, 54, 55) respectively include an epitaxially grown material selected to exhibit a tensile or compressive stress. Thus, the first, second and third epitaxial-grown doped layers (52, 54, 55) are regarded as stressor layers providing strain to the channel region 20 under the gate structure 30. The epitaxially grown material includes, for example, silicon germanium, silicon carbide, single crystalline silicon or any single crystalline semiconductor material that can be epitaxially grown. On a whole, the raised source/drain region 50, which includes germanium or carbon, provides a tensile or compress stress to the channel region 20. In an embodiment, the first epitaxial-grown doped layer 52 is made of silicon germanium, which is the same as that of the second and third epitaxial-grown doped layers (54, 55). Further, the concentration of the germanium is increasingly grading from the first epitaxial-grown doped layer 52 to the third epitaxial-grown doped layer 55. The third epitaxial-grown doped layer 55 includes a germanium concentration that is greater than these of the first and second epitaxial-grown doped layer (52, 54). Specifically, the first epitaxial-grown doped layer 52 includes a germanium concentration in a range from about 10% to about 40%. The second epitaxial-grown doped layer 54 includes a germanium concentration in a range from about 25% to about 50%. The third epitaxial-grown doped layer 55 includes a germanium concentration in a range from about 40% to about 65%. In an embodiment, the first epitaxial-grown doped layer 52 includes a germanium concentration in a range from about 10% to about 30%. The second epitaxial-grown doped layer 54 includes a germanium concentration in a range from about 40% to about 50%. The third epitaxial-grown doped layer 55 includes a germanium concentration in a range from about 50% to about 70%. The germanium concentration is adjustable to meet different requirements of strain. In addition, the first, second and third epitaxial-grown doped layers (52, 54, and 55) individually include a gradient distribution. For example, the first silicon germanium layer 52 increasingly grades from its bottommost to its topmost. The fourth epitaxial-grown doped layer 56 is made of silicon, which refers to a silicon cap layer capping the third epitaxial-grown doped layer 55.

In an embodiment, SiGe layers are employed within the raised source/drain regions 50 so as to improve PMOS performance by increasing the mobility of the carriers in the channel region 20. It is believed that the improvement is a result of the lattice mismatch that induces mechanical stress or strain across the channel region 20. Specifically, a compressive-strained channel typically provides the carrier mobility enhancement that is beneficial for the PMOS device.

In an embodiment, SiC layers are employed within the raised source/drain regions 50 so as to improve NMOS performance by increasing the mobility of the carriers in the channel region 20. It is believed that the improvement is a result of the lattice mismatch that induces mechanical stress or strain across the channel region 20. Specifically, a tensile-strained channel typically provides the carrier mobility enhancement that is beneficial for the NMOS device.

The first, second, third and fourth epitaxial-grown doped layers (52, 54, 55, and 56) are in-situ doped by, for example, n-type or p-type dopants. The in-situ dopant is opposite to the polarity of the channel region 20 including, for example, boron, germanium, indium, phosphorous, arsenic, and/or antimony. The first epitaxial-grown doped layer 52 includes the same dopant species as the second, third and fourth epitaxial-grown doped layers (54, 55, and 56). The dopant concentration is increasingly grading from the first epitaxial-grown doped layer 52 to the fourth epitaxial-grown doped layer 56. The fourth epitaxial-grown doped layer 56 includes a dopant concentration higher than these of the first, second and third epitaxial-grown doped layers (52, 54, and 55). The third epitaxial-grown doped layer 55 includes a dopant concentration higher than these of the first and second epitaxial-grown doped layer (52, 54). The second epitaxial-grown doped layer 54 includes a dopant concentration higher than that of the first epitaxial-grown doped layer 52. Further, the first, second, third and fourth epitaxial-grown doped layers (52, 54, 55, and 56) include a constant distribution of dopant concentration individually. For example, the second epitaxial-grown doped layer 54 includes a constant distribution where the dopant concentration is constant from its bottommost to its topmost. This provides a compatible and better connection between the silicide layer 40 and the raised source/drain region 50 in regard to their conductivity and resistance difference.

In addition, an epitaxy-tip 58 of the raised source/drain region 50 is under the gate structure 30. The epitaxy-tip 58 is formed by a corner of the first epitaxial-grown doped layer 52, which laterally extends into the channel region 20. Specifically, end portions (52', 54', and 55') of the first, second and third epitaxial-grown doped layers (52, 54, and 55) are underneath the gate structure 30. The end portion 55' has a contact with the interface 15. A tip depth is measured from the interface 15 to the epitaxy-tip 58. By forming the epitaxy-tip 58 in relatively close proximity to the channel region 20, a larger hydrostatic stress is induced on the channel region 20, resulting in higher carrier mobility and increased drive current. The stress exerted by the raised source/drain region 50 can be further amplified by increasing the germanium or carbon concentrations of the epitaxy-tip 58.

The silicide layer 40 is located in the raised source/drain region 50. The silicide layer 40 is shaped as a pocket profile, which is encompassed by the raised source/drain region 50. That is, the silicide layer 40 can be regarded as a silicide plug inserting into the raised source/drain region 50. The silicide layer 40 refers to a self-aligned silicide region, which includes NiSi, PtSi, TiSi or any suitable metal silicide material. The silicide layer 40 reduces the metal-silicon contact resistivity by employing different metals and/or co-implants at the silicon-contact interface in order to reduce the Schottky barrier height. Thus, the silicide layer 40 includes a sheet resistance lower than that of the raised source/drain region 50 or the second epitaxial-grown doped layer 54. That is, conductivity of the silicide layer 40 is higher than that of the raised source/drain region 50. Further, the silicide layer 40 extends from a top surface 59 of the raised source/drain region 40 and ends below the interface 15 by a predetermined depth D. That is, a bottommost portion 42 of the silicide layer 40 ends below the interface 15 by the predetermined depth D. The predetermined depth D is measured from the interface 15 to the bottommost portion 42 of the silicide layer 40. The silicide layer 40 includes a thickness ranging from about 11 nanometers to about 15 nanometers. Regardless of the silicide layer 40 thickness, the predetermined depth D shall be in a certain range. In an embodiment, the raised source/drain region 50 includes p-type dopants and the channel region 20 includes n-type dopants so as to form a PMOS. The predetermined depth D is in a range from about 0 nanometers to about 5 nanometers. In an embodiment, the raised source/drain region 50 includes n-type dopants and the channel region 20 includes p-type dopants so as to form an NMOS. The predetermined depth D is in a range from about 5 nanometers to about 11 nanometers. In an NMOS, electrons are a majority carrier in operations. Mobility of electrons is a few times faster than that of holes. As such, concerns for the contact resistance are greater than mobility so that the predetermined depth D in an NMOS is deeper than that in a PMOS. In an embodiment, the predetermined depth D is less than 5 nanometers. In an embodiment, the predetermined depth D is less than about 7 nanometers.

In the present disclosure, the predetermined depth D is controlled in a shallower range so as not to increase the summation of the contact resistance and source/drain resistance. Due to a pocket profile, a contact area between the silicide layer 40 and the raised source/drain region 50 is enlarged. The enlarged contact area provides a lower contact resistance because the resistance is inversely proportional to a geometrical cross-section. This is sufficient to reduce the contact resistance. In addition, the silicide layer 40 includes metal, which provides a lower sheet resistance. The silicide layer 40 is compatible to the raised source/drain region 50 due to a smaller resistance difference. Thus, the total resistance is dramatically reduced so that the drive currents of the device will increase by the profile of the silicide layer 40. Meanwhile, the predetermined depth D maintains the tensile or compressive stress of the channel region 20. The predetermined depth D is controlled in an optimized range so as not to break the stress structure of the raised source/drain region 50. Accordingly, the tensile or compressive stress of the channel region 20 will not be released. Thus, the predetermined depth D not only decreases the contact resistance but also keeps the strain in the channel region 20.

A dielectric layer 86 is located over the substrate 10. A contact plug 61 is located on the silicide layer 40. A bottom area of the contact plug 61 is substantially equal to or smaller than a top area 45 of the silicide layer 40. The contact plug 61 includes, for example, tungsten, copper or aluminum. The contact plug 61 serves as a wire or a via for connecting with other devices. In an embodiment, the contact plug 61 tapers from its topmost portion toward the silicide layer 40. The contact plug 61 has conductivity higher than that of the silicide layer 40. Due to the contact plug 61, the contact resistance is reduced and the drive current increases.

Figure 2A:
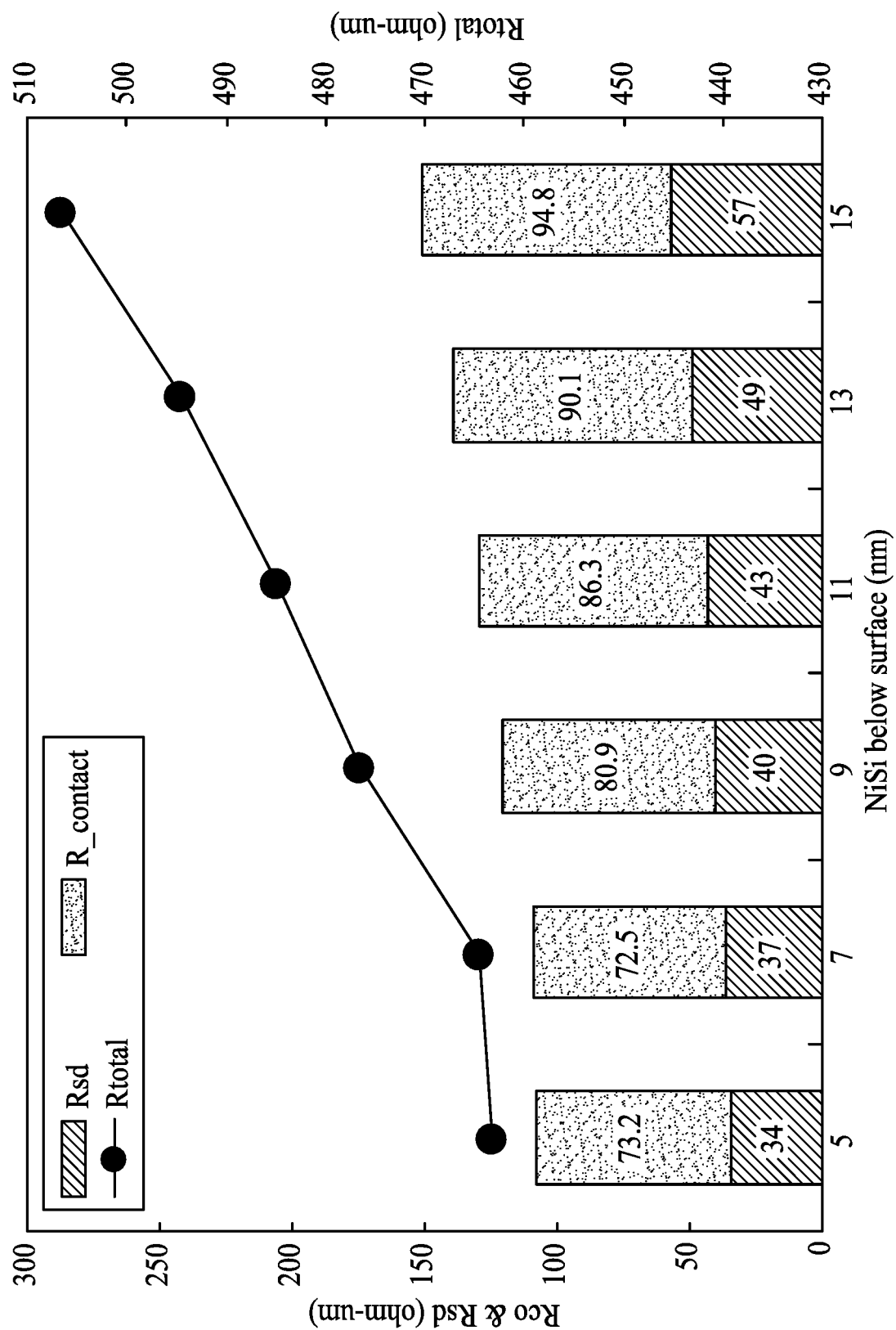
FIGS. 2A-2B are experiment results as varying a predetermined depth D in accordance with some embodiments of the present disclosure.
Figure 2B:
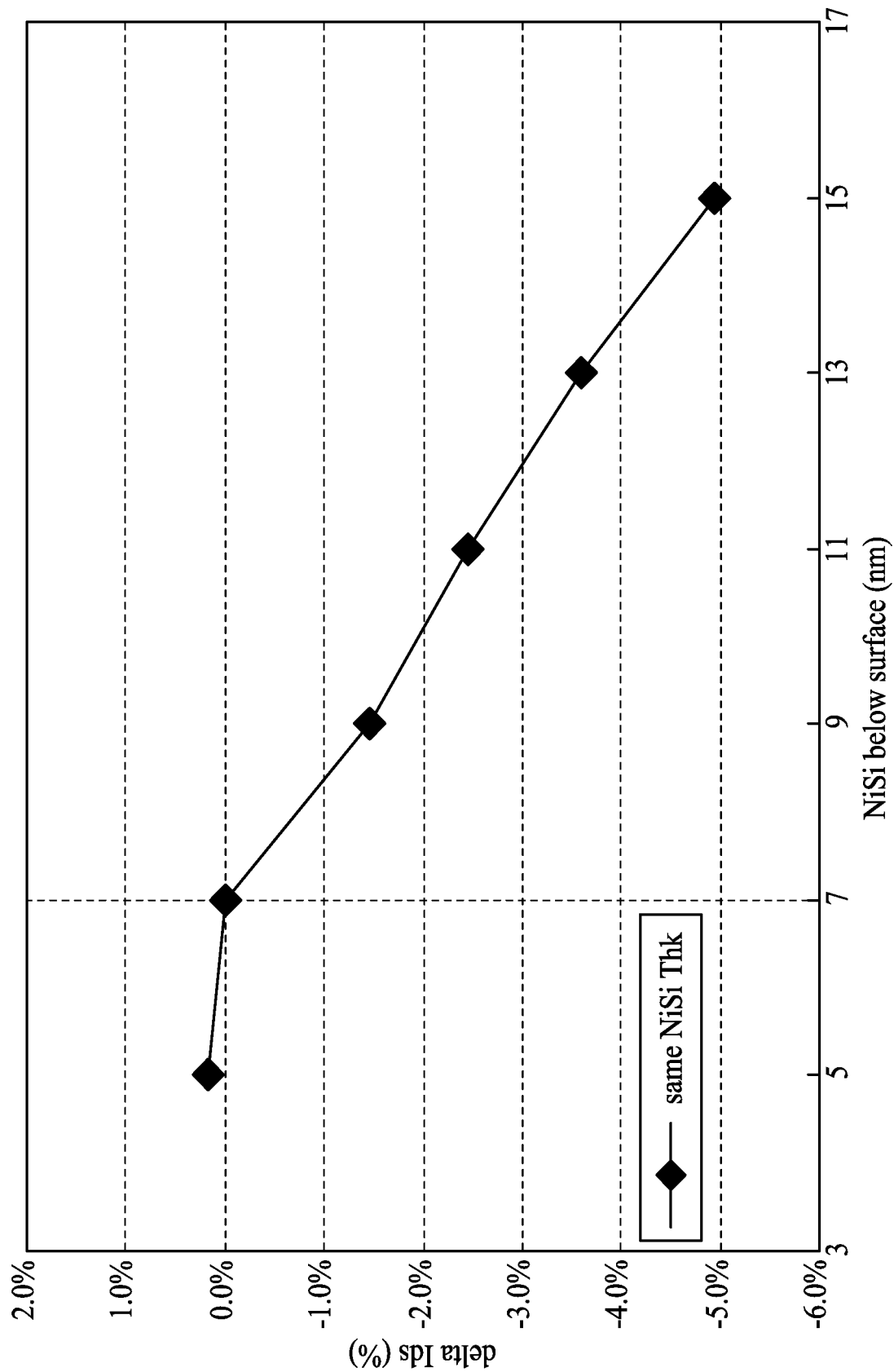

FIGS. 2A-2B are experiment results as varying the predetermined depth D in accordance with some embodiments of the present disclosure. Referring to FIG. 2A, a horizontal axis refers to the predetermined depth D, which is measured from the interface 15 to the bottommost portion 42. The silicide layer 40 is made of NiSi. A left vertical axis corresponding to histograms refers to the contact resistance value and source/drain resistance value respectively. A right vertical axis corresponding to a line chart refers to a total resistance value including a channel resistance $R_{CH}$ and an external resistance $R_{EXT}$ including, for example, the contact resistance, the source/drain resistance, and a channel resistance. As the predetermined depth D is 5 nanometers, the source/drain resistance is 34 ohm-µm and the contact is 73.2 ohm-µm. The total resistance is about 460-470 ohm-µm. As the predetermined depth D is 15 nanometers, the source/drain resistance is 57 ohm-µm and the contact resistance is 94.8 ohm-µm. The total resistance is about 500-510 ohm-µm. As the predetermined depth D becomes deeper, the contact resistance and the source/drain resistance both increase accordingly. The total resistance dramatically increases when the predetermined depth D increases from about 5 to about 15 nanometers. In addition, it shows that the predetermined depth D at about 7 nanometers is a critical point where the total resistance starts to jump up as the predetermined depth D is larger than about 7 nanometers. As such, a deeper silicide layer extending into the raised source/drain region 50 shows an increased summation of the contact resistance and source/drain resistance, which is higher than that of a shallow silicide layer (D is below about 7 nanometers). As such, the summation of the contact resistance and source/drain resistance increases in proportional to the depth of the silicide layer 40.

Referring to FIG. 2B, a horizontal axis refers to the predetermined depth D. A left vertical axis refers to a delta saturation current, which is compared to an original saturation current at about 5 nanometers of the predetermined depth D. The delta saturation current is set as 0% when the predetermined depth D is about 5 nanometers. As the predetermined depth D increased to about 15 nanometers, the delta saturation current becomes −5.0%. That is, the saturation current at about 15 nanometers is about 5.0% less than that of at about 5 nanometers. It shows that the saturation current will dramatically drop when the predetermined depth D is greater than about 7 nanometers. The deeper silicide layer also makes the saturation current degraded and releases the strain of the channel region 20.

FIGS. 3A-3F are cross-sectional diagrams illustrating a manufacturing process of the semiconductor device 100 of FIG. 1 in accordance with some embodiments of the present disclosure. Each figure may refer to a step of a process for manufacturing the semiconductor device 100.

Referring to FIG. 3A, fabrication of the semiconductor device 100 begins by providing a substrate 10 including a gate structure 30, which is located on the substrate 10. A gate dielectric 32 is formed over a channel region 20 of the substrate 10. In one embodiment, the gate dielectric 32 is formed by any well-known methods, such as, but not limited to, physical vapor deposition (PVD), chemical vapor deposition (CVD) or atomic layer deposition (ALD). The gate electrode 33 is formed over the gate dielectric 32. A hard mask (not shown) is formed on a top of the gate electrode 33. In an embodiment, the gate electrode 33 and the hard mask are deposited using PVD or CVD, and then patterned using well-known photolithography and etching techniques. Sidewall spacers 34 are then formed on opposite sidewalls of the gate electrode 33. In one embodiment, the sidewall spacers 34 are formed by using well-known techniques, such as depositing a layer of spacer material over the substrate 10, including the gate electrode 33, and then anisotropically etching the layer of spacer material to form the sidewall spacers 34.

Figure 3B:
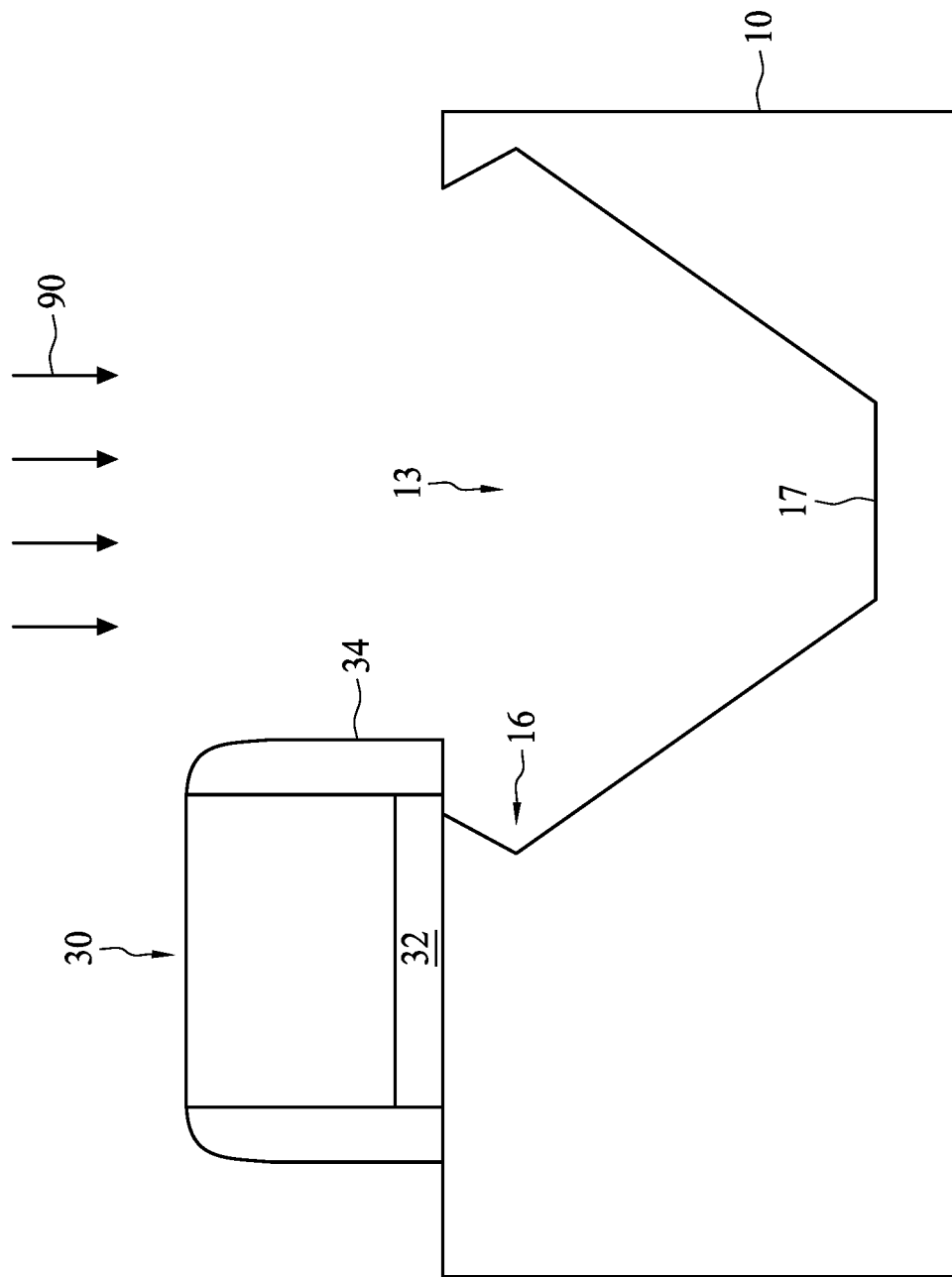

Referring to FIG. 3B, a cavity 13 is formed in the substrate 10 and adjacent to the gate structure 30 by using an etch process 90. A protect layer (not shown) may be deposited on the gate structure 30 and other regions for protection. The cavity 13 is a U-shaped profile or a polygon profile. The cavity 13 further includes an epitaxy-tip cavity 16 encroaching substrate material under the gate structure 30. The cavity 13 is vertically formed into the substrate 10 with a depth, for example, between about 10 nm and about 80 nm. It is also within the scope of the disclosure to etch the cavity 13 to any suitable depth. In addition, the etching process 90 is an isotropic etch that undercuts a portion of the substrate 10 under the gate structure 30. For example, the etching process 90 is a wet etching process. The substrate material of the substrate 10 is laterally etched so that the cavity 13 exposes a bottom portion of the gate structure 30. Specifically, a bottom portion of the sidewall spacers 34 and a bottom portion of the gate dielectric 32 are exposed.

In an embodiment, a hydrogen bake treatment is performed on a bottom surface 17 for pre-treatment. The hydrogen bake treatment desorbs oxygen and renders surface reconstruction so that the bottom surface 17 can readily nucleate without formation of defects.

Figure 3C:
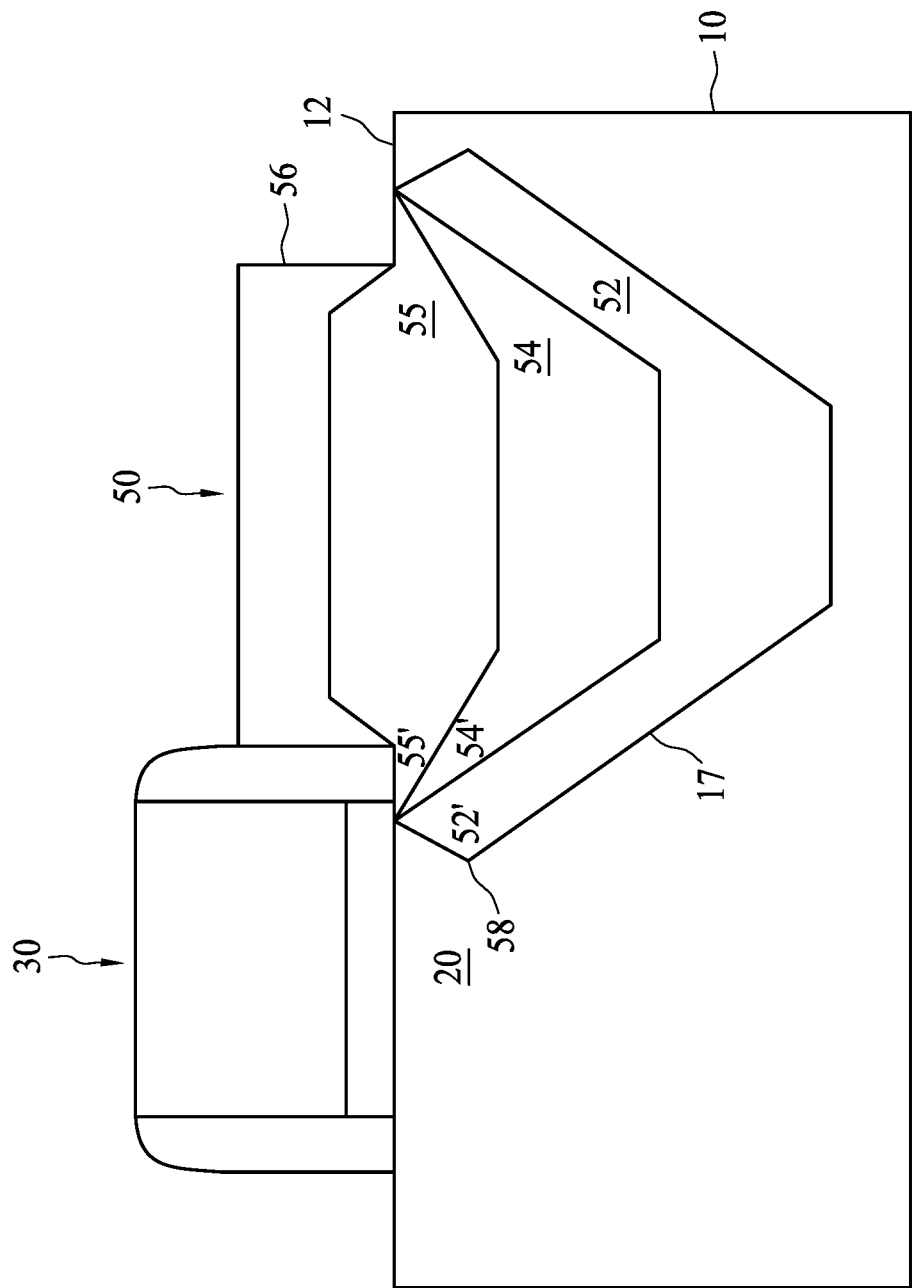

Referring to FIG. 3C, a first epitaxial deposition is performed to epitaxially grow a first epitaxial-grown doped layer 52 on the bottom surface 17. The epitaxy-tip cavity 16 is filled up by an end portion 52' of the first epitaxial-grown doped layer 52 so as to form an epitaxy-tip 58. By forming the epitaxy-tip 58 in relatively close proximity to the channel region 20, a larger hydrostatic stress is induced on the channel region 20, resulting in higher carrier mobility and increased drive current. Moreover, the first epitaxial deposition includes a precursor, for example, a silicon-containing compound, a germanium-containing compound, and a dopant. The first epitaxial-grown doped layer 52 is doped in-situ with p-type or n-type dopants during the first epitaxial deposition. The silicon-containing compound includes, but is not limited to, silane (SiH4), disilane (Si2H6), trisilane (Si3H8), dichlorosilane (SiH2Cl2), and penta-chloro silane. The germanium-containing compound includes, for example, germane (GeH$_4$). Thus, the first epitaxial-grown doped layer 52 includes silicon germanium.

A second epitaxial deposition is performed to selectively form a second epitaxial-grown doped layer 54 on the first epitaxial-grown doped layer 52. The first epitaxial-grown doped layer 52 serves as a seed layer for the second epitaxial deposition. The second epitaxial deposition backfills a portion of the cavity 13 underneath the gate structure 30 so as to form an end portion 54'. The second epitaxial deposition has an epitaxial semiconductor material that is the same as that of the first epitaxial deposition. Further, the second epitaxial deposition includes a precursor with a germanium concentration higher than that of the first epitaxial deposition. During the second epitaxial deposition, an amount of the germanium gradually increases so as to form a gradient distribution. In addition, the second epitaxial deposition includes the same dopant species as the first epitaxial deposition. Dopant concentration of the second epitaxial deposition is higher than that of the first epitaxial deposition. During the second epitaxial deposition, the dopant concentration of the precursor is constant so as to form a constant distribution.

A third epitaxial deposition is performed to selectively form a third epitaxial-grown doped layer 55 on the second epitaxial-grown doped layer 54. The second epitaxial-grown doped layer 54 serves as a seed layer for the third epitaxial deposition. The third epitaxial deposition backfills a remaining portion of the cavity 13 underneath the gate structure 30 so as to form an end portion 55'. The third epitaxial deposition continues to deposit and elevate from a surface 12 of the substrate 10. The third epitaxial deposition has an epitaxial semiconductor material that is the same as that of the first or second epitaxial deposition. Further, the third epitaxial deposition includes a precursor with a germanium concentration higher than that of the second epitaxial deposition. During the third epitaxial deposition, an amount of the germanium gradually increases so as to form a gradient distribution. In addition, the third epitaxial deposition includes the same dopant species as the first epitaxial deposition. Dopant concentration of the third epitaxial deposition is higher than that of the second epitaxial deposition. During the third epitaxial deposition, the dopant concentration of the precursor is constant so as to form a constant distribution.

A fourth epitaxial deposition is performed to form a fourth epitaxial-grown doped layer 56 on the third epitaxial-grown doped layer 55. The fourth epitaxial deposition includes silicon-containing compounds and dopants. Thus, the fourth epitaxial-grown doped layer 56 includes silicon which is regarded as a silicon capping layer. In addition, the fourth epitaxial deposition includes the same dopant species as the first epitaxial deposition. Dopant concentration of the fourth epitaxial deposition is higher than that of the third epitaxial deposition. By the first, second, third and fourth epitaxial depositions, a raised source/drain region 50 are formed. In some embodiments, the epitaxial deposition/partial etch process is repeated a number of times until a desired thickness is reached. Such repeated deposition/partial etch process is also called a cyclic deposition/etch (CDE) process.

Figure 3D:
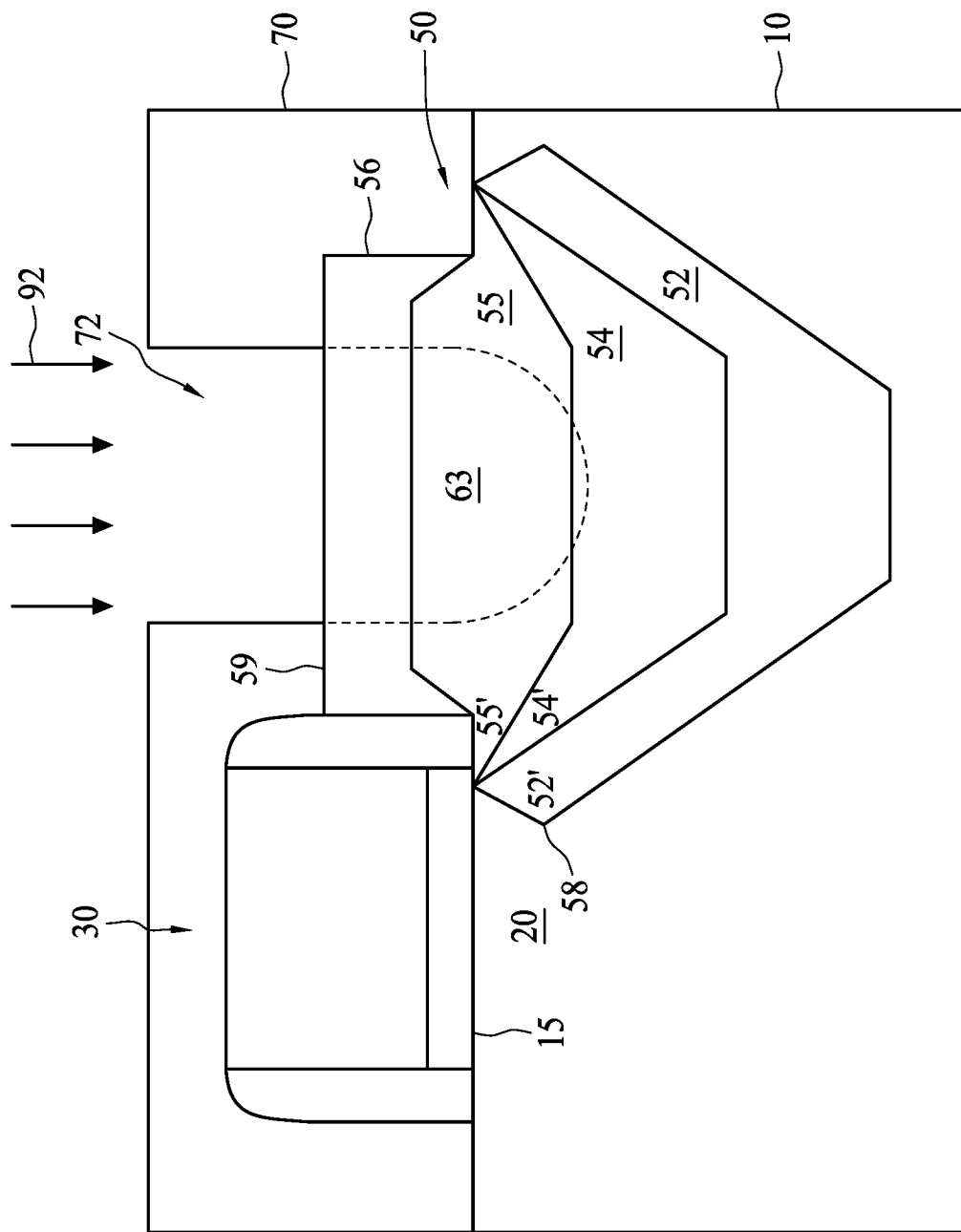

Referring to FIG. 3D, a mask layer 70 is formed on the substrate 10. The mask layer 70 includes standard resist protect oxide (RPO), for example, silicon oxide or silicon nitride. A photoresist layer (not shown) is deposited over the mask layer 70. A lithography process is performed to define a position for a predetermined silicide region. Later, an etching process is performed to pattern the mask layer 70 and form an opening 72. The opening 72 exposes a portion of the top surface 59 of the fourth epitaxial-grown doped layer 56. That is, an area of the opening 72 is smaller than the top surface 59. A pre-amorphous implantation (PAI) 92 is performed to match the opening 72 and implant dopant into the raised source/drain region 50. The PAI 92 includes dopant species, for example, xenon which is a heavy ion with the appropriate inertial properties. The PAI 92 breaks the single crystal bonding of the raised source/drain region 50 and turns the single crystal bonding into amorphous bonding. Thus, an amorphous region 63 defined by the opening 72 is formed in the raised source/drain region 50. The PAI 92 includes an energy ranging from about 3 to 7 KeV. The PAI 92 is controlled in a lower energy range in order to keep the amorphous region 63 at a shallow depth. Having the PAI 92 at a high energy level or at a high dose is prohibited because a profile of a silicide layer is controlled in a predetermined depth below an interface 15 just within a few nanometers. The interface 15 is between the gate structure 30 and the channel region 20. Doses, energies, and tilt angles may be varied within the spirit and scope of this illustrative embodiment.

Figure 3E:
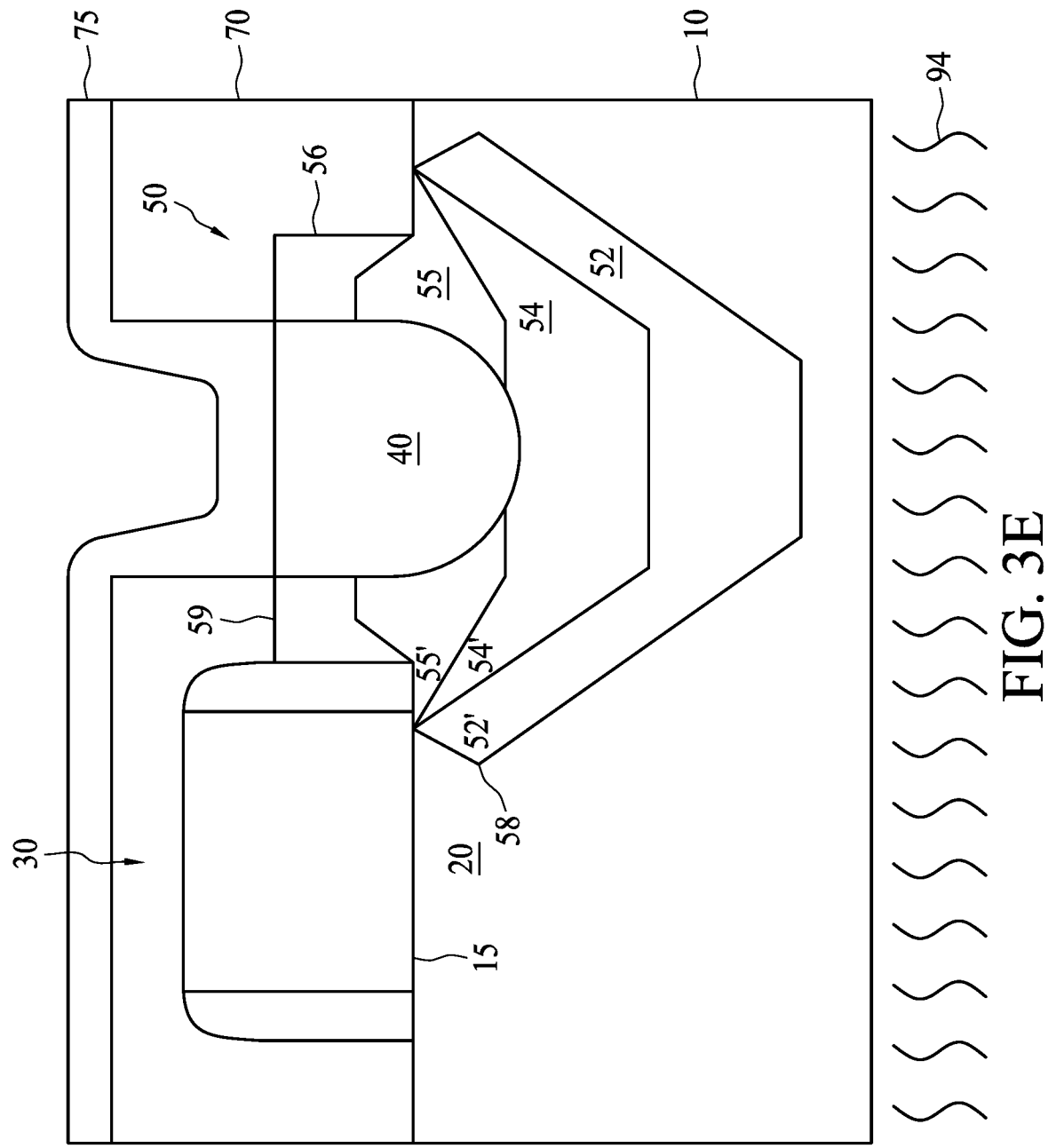

Referring to FIG. 3E, a metal layer 75 is deposited over the mask layer 70 and the fourth epitaxial-grown doped layer 56. Exemplary and non-limiting metals that can be deposited include nickel, platinum or titanium. The thickness of the metal layer 75 is about several angstroms, which may be about 6 angstroms to about 8 angstroms. Later, an annealing process 94 is performed to silicide a portion of the raised source/drain region 50. Specifically, the metal layer 75 reacts with the amorphous region 63 shown in FIG. 3D. The annealing process 94 thus produces a silicide layer 40 in the raised source/drain region 50, which is formed based on the amorphous region 63. It is noted that any extended defect lines induced by the PAI 92 are not exacerbated by the formation of the silicide layer 40 because the silicide layer 40 is contained within the amorphous region 63. The annealing process 94 includes at least one thermal treatment, for example, rapid thermal annealing, laser annealing or flash annealing. The silicide layer 40 includes, for example, NiSi, PtSi or TiSi. NiSi has many advantages over both titanium and cobalt silicide because of its low consumption rate of silicon, low resistivity (reported to be in the range of 15-20 μOhm/cm), and most importantly, limited or no narrow-line effects. Later, remaining portions of the metal layer 75 are stripped by a wet etch or a dry etch. During formation of the silicide layer 40, the silicide layer 40 is free from any oxygen or hydrogen peroxide treatment so as to prevent a deeper depth of the silicide layer 40.

Figure 3F:
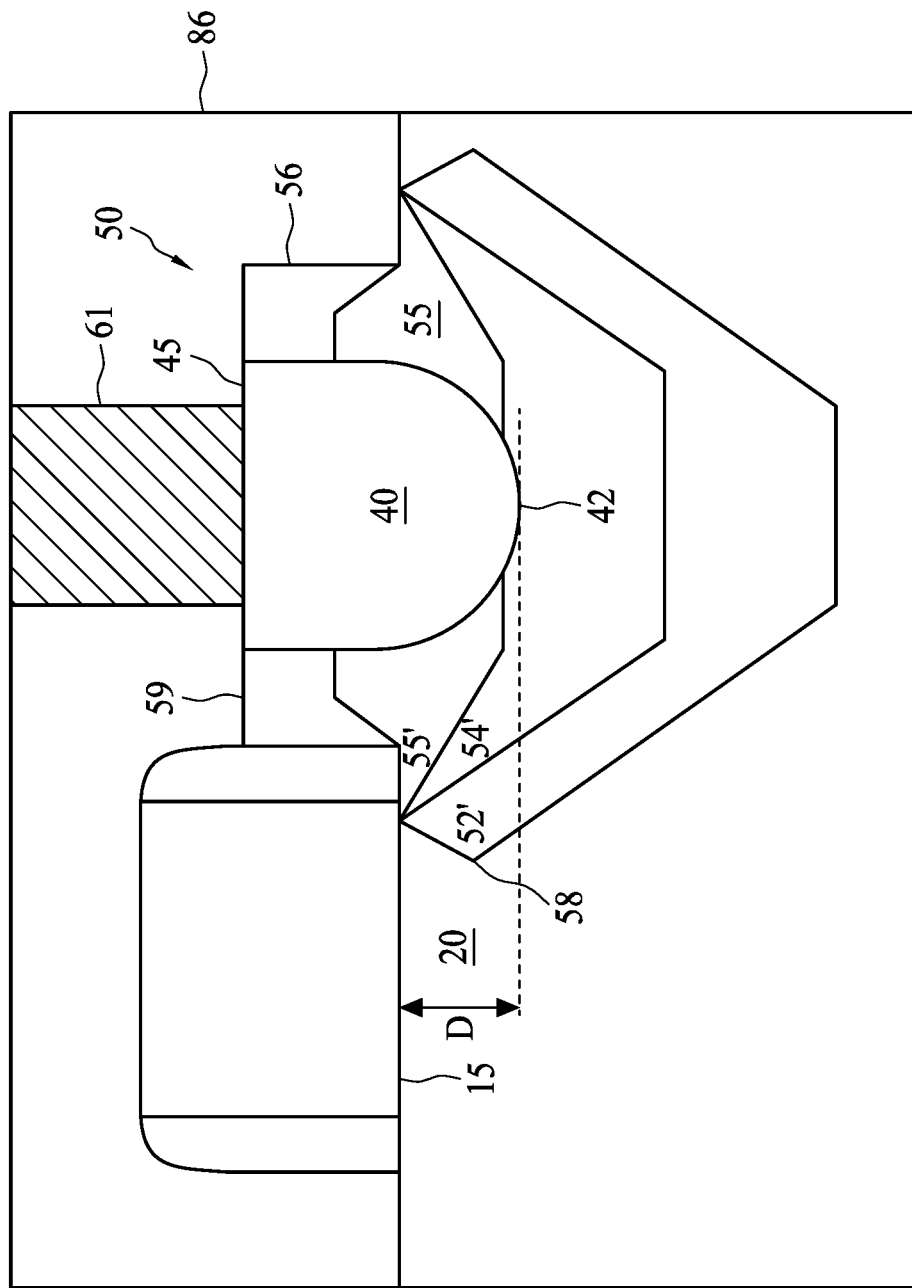

Referring to FIG. 3F, a dielectric layer 86 is deposited over the substrate 10. The dielectric layer 86 includes, for example, a layer of borophosphosilicate glass (BPSG) between 5,000 and 15,000 Angstroms thickness. A photoresist layer (not shown) is applied over the dielectric layer 86. A standard photolithographic technique is performed to pattern the photoresist layer. An etching process is employed to etch the dielectric layer 86 and form a contact opening, which exposes a top surface 45 of the silicide layer 40. An area of the contact opening is equal to or smaller than the top surface 45. A contact metal layer is then deposited in a blanketed fashion into the contact opening so as to be in contact with the silicide layer 40. The contact metal includes copper, aluminum, or tungsten. Later, a polishing process, such as Chemical Mechanical Polishing, is used to remove uneven portions of the contact metal layer. As such, a contact plug 61 is thus formed on the silicide layer 40.

In brief, the silicide layer 40 is encompassed by the raised source/drain region 50. The silicide layer 40 extends from a top surface 59 into the raised source/drain region 50. A bottommost portion 42 of the silicide layer 40 ends below the interface 15 by a predetermined depth D. The predetermined depth D is strictly controlled within a few nanometers so that strain in the channel region 20 is maintained and the contact resistance is reduced. Due to the reduced contact resistance and higher mobility of carriers, drive current of the device is dramatically increased.

A semiconductor device includes a gate structure located on a substrate; and a raised source/drain region adjacent to the gate structure. An interface is between the gate structure and the substrate. The raised source/drain region includes a stressor layer providing strain to a channel under the gate structure; and a silicide layer in the stressor layer. The silicide layer extends from a top surface of the raised source/drain region and ends below the interface by a predetermined depth. The predetermined depth allows the stressor layer to maintain the strain of the channel.

In some embodiments, the silicide layer includes a sheet resistance lower than that of the stressor layer.

In some embodiments, the silicide layer is encompassed by the raised source/drain region.

In some embodiments, the semiconductor device further includes a contact plug located on the silicide layer. A bottom area of the contact plug is substantially equal to or smaller than a top area of the silicide layer.

In some embodiments, the raised source/drain region includes p-type dopants. The predetermined depth is in a range from about 0 nanometers to about 5 nanometers.

In some embodiments, the silicide layer includes a thickness ranging from about 11 nanometers to about 15 nanometers.

In some embodiments, the silicide layer includes nickel silicide. The stressor layer includes silicon germanium.

In some embodiments, the stressor layer further includes a first silicon germanium layer at a bottom of the stressor layer; a second silicon germanium layer on the first silicon germanium layer; a third silicon germanium layer on the second silicon germanium layer; and a silicon cap layer over the third silicon germanium layer. The second silicon germanium layer includes a germanium concentration that is greater than that of the first silicon germanium layer. The third silicon germanium layer includes a germanium concentration that is greater than that of the second silicon germanium layer. The first, second and third silicon germanium layers individually include a gradient distribution of the germanium concentration.

In some embodiments, the first silicon germanium layer includes a germanium concentration in a range from about 10% to about 40%. The second silicon germanium layer includes a germanium concentration in a range from about 25% to about 50%. The third silicon germanium layer includes a germanium concentration in a range from about 40% to about 65%.

A semiconductor device includes a gate structure located on a substrate; a raised source/drain region adjacent to the gate structure; and a silicide plug located in the raised source/drain region. An interface is between the gate structure and the substrate. The raised source/drain region includes an epitaxially grown material selected to exhibit a tensile or compressive stress provided to a channel under the gate structure. A bottommost portion of the silicide layer ends below the interface by a predetermined depth so as to enlarge a contact area coupling with the raised source/drain region. The predetermined depth is allowed to reduce contact resistance and maintain the tensile or compressive stress of the channel region.

In some embodiments, the silicide plug extends from a top surface of the raised source/drain region and includes a pocket profile encompassed by the raised source/drain region.

In some embodiments, the raised source/drain region includes n-type dopants. The predetermined depth is in a range from about 5 nanometers to about 11 nanometers.

In some embodiments, the predetermined depth is less than 7 nanometers.

In some embodiments, the raised source/drain region further includes a first epitaxial-grown doped layer; a second epitaxial-grown doped layer including a dopant concentration higher than that of the first epitaxial-grown doped layer; a third epitaxial-grown doped layer including a dopant concentration higher than that of the second epitaxial-grown doped layer; and a fourth epitaxial-grown doped layer including a dopant concentration higher than the first, second and third epitaxial-grown doped layers.

In some embodiments, the first, second, third and fourth epitaxial-grown doped layers individually include a constant distribution of a dopant concentration.

A method for manufacturing a semiconductor device includes providing a substrate including a gate structure on the substrate; forming a cavity in the substrate and adjacent to the gate structure by an etching process; epitaxially growing a semiconductor material to fill the cavity, thereby forming a raised source/drain region; generating an amorphous layer in the raised source/drain region by a pre-amorphous implanting process; depositing a metal on the amorphous layer; and reacting the metal with the amorphous layer and forming a silicide layer within the raised source/drain region.

In some embodiments, the silicide layer is free from any oxygen or hydrogen peroxide treatment.

In some embodiments, the pre-amorphous implanting process includes an energy ranging from about 3 to 7 KeV.

In some embodiments, the step of epitaxially growing a semiconductor material further includes performing a first epitaxial deposition to form a first silicon germanium layer on a bottom surface of the cavity; performing a second epitaxial deposition to form a second silicon germanium layer on the first silicon germanium layer; performing a third epitaxial deposition to form a third silicon germanium layer on the second silicon germanium layer; and performing a fourth epitaxial deposition to form a silicon layer on the second silicon germanium layer. The second epitaxial deposition includes a precursor with a germanium concentration higher than that of the first epitaxial deposition. The third epitaxial deposition includes a precursor with a germanium concentration higher than that of the second epitaxial deposition.

In some embodiments, the silicide layer is formed based on the amorphous layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   providing a substrate comprising a gate structure on the substrate;
   forming a cavity in the substrate and adjacent to the gate structure by an etching process;
   epitaxially growing a semiconductor material to fill the cavity, thereby forming a raised source/drain region, including:
      performing a first epitaxial deposition to form a first silicon germanium layer on a bottom surface of the cavity;
      performing a second epitaxial deposition to form a second silicon germanium layer on the first silicon germanium layer, wherein the second epitaxial deposition comprises a precursor with a germanium concentration higher than that of the first epitaxial deposition;
      performing a third epitaxial deposition to form a third silicon germanium layer on the second silicon germanium layer, wherein the third epitaxial deposition comprises a precursor with a germanium concentration higher than that of the second epitaxial deposition; and
      performing a fourth epitaxial deposition to form a silicon layer on the third silicon germanium layer;
   generating an amorphous layer in the raised source/drain region by a pre-amorphous implanting process;
   depositing a metal on the amorphous layer; and
   reacting the metal with the amorphous layer and forming a silicide layer within the raised source/drain region.

2. The method of claim 1, wherein the silicide layer is free from any oxygen or hydrogen peroxide treatment.

3. The method of claim 1, wherein the pre-amorphous implanting process comprises an energy ranging from about 3 to 7 KeV.

4. The method of claim 1, wherein the silicide layer is formed based on the amorphous layer.

5. A method for manufacturing a semiconductor device, comprising:
   providing a substrate including a gate structure on the substrate;
   forming a cavity in the substrate and adjacent to the gate structure by an etching process;
   epitaxially growing a semiconductor material to fill the cavity, thereby forming a raised source/drain region, including:
      epitaxially depositing a first silicon germanium layer by using a first precursor;
      epitaxially depositing a second silicon germanium layer on the first silicon germanium layer by using a second precursor with a germanium concentration higher than that of the first precursor;
      epitaxially depositing a third silicon germanium layer on the second silicon germanium layer by using a third precursor with a germanium concentration higher than that of the second precursor; and
      epitaxially growing a silicon cap layer over the second silicon germanium layer; and
   forming a silicide layer in the raised source/drain region, wherein the silicide layer extends from a top surface of the raised source/drain region and ends below an interface between the gate structure and the substrate by a predetermined depth.

6. The method of claim 5, wherein the formation of the silicide layer comprises:
   forming the silicide layer including a sheet resistance lower than that of the raised source/drain region.

7. The method of claim 5, wherein the formation of the silicide layer comprises:
   forming the silicide layer in the raised source/drain region to allow the raised source/drain region to encompass the silicide layer.

8. The method of claim 5, further comprising:
   forming a contact plug on the silicide layer, wherein a bottom area of the contact plug is substantially equal to or smaller than a top area of the silicide layer.

9. The method of claim 5, wherein the raised source/drain region includes p-type dopants and the predetermined depth is in a range from about 0 nanometers to about 5 nanometers.

10. The method of claim 5, wherein the silicide layer includes a thickness ranging from about 11 nanometers to about 15 nanometers.

11. The method of claim 5, wherein the silicide layer includes nickel silicide, and the stressor layer includes silicon germanium.

12. The method of claim 5, wherein the first silicon germanium layer includes a germanium concentration in a range from about 10% to about 40%, and the second silicon germanium layer includes a germanium concentration in a range from about 25% to about 50%, and the third silicon germanium layer includes a germanium concentration in a range from about 40% to about 65%.

13. A method for manufacturing a semiconductor device comprising:
provide a substrate including a gate structure on the substrate;
forming a cavity in the substrate and adjacent to the gate structure by an etching process;
epitaxially growing a first layer in the cavity;
epitaxially growing a second layer on the first layer;
epitaxially growing a third layer on the second layer, wherein a dopant concentration of an epitaxially grown material increasingly grades from the first layer to the third layer; and
forming a silicide layer penetrating a top surface of the third layer and extending into at least the second layer, and the silicide layer being partially below an interface between the gate structure and the substrate by a predetermined depth.

14. The method of claim 13, wherein the first layer, the second layer and the third layer individually includes a gradient distribution of the dopant concentration of the epitaxially grown material.

15. The method of claim 13, wherein the formation of the silicide layer comprises:
forming the silicide layer including a sheet resistance lower than that of the third layer.

16. The method of claim 15, wherein the silicide layer is free from any oxygen or hydrogen peroxide treatment.

17. The method of claim 13, further comprising:
forming a contact plug on the silicide layer, wherein a bottom area of the contact plug is substantially equal to or smaller than a top area of the silicide layer.

18. The method of claim 13, wherein the formation of the silicide layer comprises:
forming the silicide layer including a sheet resistance lower than that of the second layer.

19. The method of claim 13, wherein the first layer, the second layer and the third layer include p-type dopants.

20. The method of claim 13, wherein the predetermined depth is in a range from about 0 nanometers to about 5 nanometers.

* * * * *